United States Patent
Hirai et al.

(10) Patent No.: US 10,498,320 B2
(45) Date of Patent: Dec. 3, 2019

(54) TRANSMITTER AND TRANSMISSION/RECEPTION SYSTEM

(71) Applicant: THINE ELECTRONICS, INC., Tokyo (JP)

(72) Inventors: Yusaku Hirai, Tokyo (JP); Akihiro Moto, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 15/659,772

(22) Filed: Jul. 26, 2017

(65) Prior Publication Data

US 2018/0034455 A1    Feb. 1, 2018

(30) Foreign Application Priority Data

Jul. 29, 2016  (JP) .................................. 2016-149246

(51) Int. Cl.
| | |
|---|---|
| *H03K 5/00* | (2006.01) |
| *H03K 5/24* | (2006.01) |
| *H03K 17/60* | (2006.01) |

(52) U.S. Cl.
CPC ............ *H03K 5/24* (2013.01); *H03K 17/603* (2013.01)

(58) Field of Classification Search
CPC .............................. H03K 5/24; H03K 17/603
USPC ......................................................... 327/108
See application file for complete search history.

(56) References Cited

U.S. PATENT DOCUMENTS

| | | | | |
|---|---|---|---|---|
| 6,906,549 | B2* | 6/2005 | Schoenborn | H04L 25/45 326/21 |
| 7,427,872 | B2* | 9/2008 | Schoenborn | H04L 25/45 326/14 |
| 8,212,587 | B2* | 7/2012 | Yeung | H04B 3/36 326/82 |
| 8,461,868 | B1* | 6/2013 | Wang | H04L 25/0272 326/21 |
| 2002/0130680 | A1* | 9/2002 | Meyer | H03K 19/0005 326/30 |
| 2010/0105319 | A1* | 4/2010 | Yeung | H04B 3/36 455/18 |
| 2018/0034454 | A1* | 2/2018 | Hirai | H03K 17/603 |
| 2018/0048312 | A1* | 2/2018 | Lung | H03K 19/018571 |

* cited by examiner

*Primary Examiner* — Ryan Jager
(74) *Attorney, Agent, or Firm* — Sughrue Mion, PLLC

(57) ABSTRACT

A transmitter includes: an output driver that outputs differential signals to differential signal lines; first termination resistors and a first switch which are provided in series between a first reference voltage input terminal to which a reference voltage is inputted and the differential signal lines; a pulse generator that outputs a common-mode pulse to the differential signal lines during a period during which a pulse output instruction signal is at a significant level; and a detector that outputs a detection result signal indicating a magnitude relationship between a voltage level of the common-mode pulse and a threshold, during a period during which the pulse output instruction signal is at a significant level, and outputs a detection result signal indicating that the voltage level of the common-mode pulse does not exceed the threshold, during a period during which the pulse output instruction signal is at a non-significant level.

2 Claims, 16 Drawing Sheets

Fig.15

| S | R | $Q_n$ | $QB_n$ |
|---|---|---|---|
| 0 | 0 | X | X |
| 1 | 0 | 1 | 0 |
| 0 | 1 | 0 | 1 |
| 1 | 1 | $Q_{n-1}$ | $QB_{n-1}$ |

TRANSMITTER AND TRANSMISSION/RECEPTION SYSTEM

TECHNICAL FIELD

The present disclosure relates to a transmitter and a transmission/reception system.

BACKGROUND

U.S. Pat. No. 7,427,872 (Patent Document 1) and U.S. Pat. No. 8,212,587 (Patent Document 2) disclose inventions of transmitters and receivers that are capable of performing signal transmission conforming to the Universal Serial Bus (USB) 3.1 standard. The transmitters described in these documents are devices that transmit differential signals to a receiver via differential signal lines having AC coupling capacitors provided in the middle thereof, and have an RX-Detect function that detects whether the receiver is connected to the differential signal lines in a receivable state.

The present inventors have found that the transmitters described in Patent Documents 1 and 2 may perform erroneous detection upon RX-Detect.

The present disclosure describes a transmitter capable of suppressing erroneous detection upon RX-Detect, and a transmission/reception system including such a transmitter and a receiver.

A transmitter according to one aspect of the present disclosure is a transmitter that transmits differential signals to a receiver via differential signal lines having AC coupling capacitors provided in middle of the differential signal lines, and includes (1) an output driver configured to output the differential signals to the differential signal lines; (2) first termination resistors and a first switch, the first termination resistors and the first switch being provided in series between a first reference voltage input terminal and the differential signal lines, a reference voltage being inputted to the first reference voltage input terminal; (3) a pulse generator configured to output a common-mode pulse to the differential signal lines during a period during which a pulse output instruction signal is at a significant level; and (4) a detector configured to output a detection result signal indicating a magnitude relationship between a voltage level of the common-mode pulse and a threshold, during a period during which the pulse output instruction signal is at a significant level, and output a detection result signal indicating that the voltage level of the common-mode pulse does not exceed the threshold, during a period during which the pulse output instruction signal is at a non-significant level.

BRIEF DESCRIPTION OF THE DRAWINGS

FIG. 15 is a truth table for the input and output signals to/from an SR flip-flop 179.

DETAILED DESCRIPTION

Figure 1:
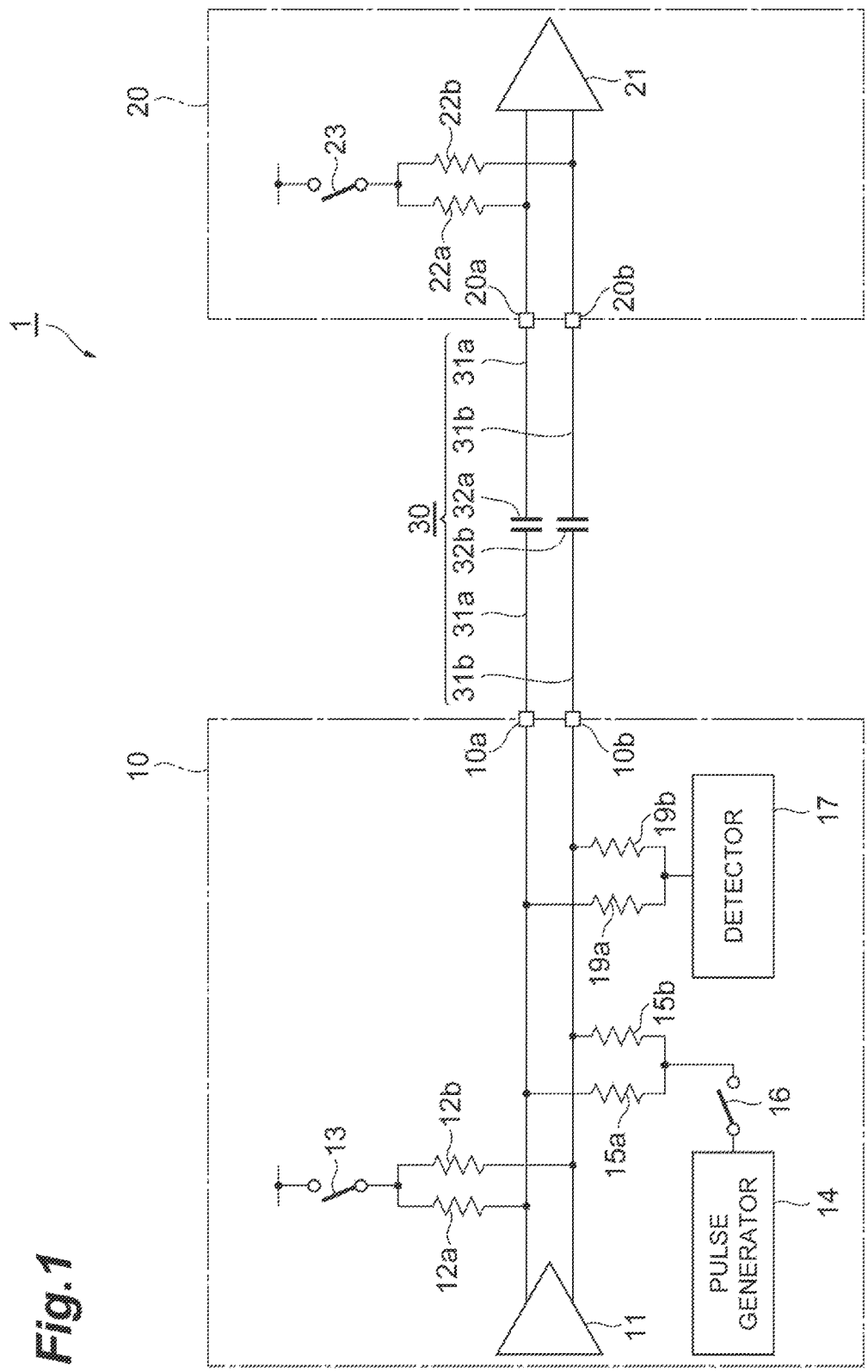
FIG. 1 is a diagram showing a schematic configuration of a transmission/reception system 1.

Description of an Embodiment of the Present Disclosure

First, an embodiment of the present disclosure is listed and described.

A transmitter according to one aspect of the present disclosure is a transmitter that transmits differential signals to a receiver via differential signal lines having AC coupling capacitors provided in middle of the differential signal lines, and includes (1) an output driver configured to output the differential signals to the differential signal lines; (2) first termination resistors and a first switch, the first termination resistors and the first switch being provided in series between a first reference voltage input terminal and the differential signal lines, a reference voltage being inputted to the first reference voltage input terminal; (3) a pulse generator configured to output a common-mode pulse to the differential signal lines during a period during which a pulse output instruction signal is at a significant level; and (4) a detector configured to output a detection result signal indicating a magnitude relationship between a voltage level of the common-mode pulse and a threshold, during a period during which the pulse output instruction signal is at a significant level, and output a detection result signal indicating that the voltage level of the common-mode pulse does not exceed the threshold, during a period during which the pulse output instruction signal is at a non-significant level.

The detector may include: (a) a comparator having a first input terminal, a second input terminal, and an output terminal and configured to compare magnitudes between a voltage inputted to the first input terminal and a threshold inputted to the second input terminal, and output a comparison result signal having a voltage level according to a result of the comparison, as the detection result signal, from the output terminal; (b) a second switch provided between the differential signal lines and the first input terminal of the comparator and configured to go into an on state when the pulse output instruction signal is at a significant level; and (c) a third switch provided between a low-voltage terminal to which a voltage lower than the threshold is inputted and the first input terminal of the comparator and configured to go into an on state when the pulse output instruction signal is at a non-significant level.

The detector may include: (a) a comparator having a first input terminal, a second input terminal, and an output terminal and configured to compare magnitudes between a voltage of the common-mode pulse inputted to the first input terminal and a threshold inputted to the second input terminal, and output a comparison result signal going to a significant level when the voltage of the common-mode pulse exceeds the threshold, from the output terminal; and (b) a gate circuit configured to output a signal indicating an AND between the comparison result signal and the pulse output instruction signal, as the detection result signal.

The detector may include: (a) a comparator having a first input terminal, a second input terminal, and an output terminal and configured to compare magnitudes between a voltage of the common-mode pulse inputted to the first input terminal and a threshold inputted to the second input terminal, and output a comparison result signal going to a significant level when the voltage of the common-mode pulse exceeds the threshold, from the output terminal; and (b) a latch circuit configured to continuously output a significant-level signal as the detection result signal after the comparison result signal changes to a significant level during a period during which the pulse output instruction signal is at a significant level.

A transmission/reception system according to another aspect of the present disclosure includes the above-described transmitter; and a receiver connected to the transmitter by the differential signal lines. The receiver includes: an input buffer configured to accept, as input, differential signals arriving from the transmitter via the differential signal lines; and second termination resistors and a forth switch which are provided in series between a second reference voltage input terminal to which a reference voltage is inputted and the differential signal lines.

According to the present disclosure, erroneous detection upon RX-Detect can be suppressed.

Detail of an Embodiment of the Present Disclosure

Specific examples of a transmitter and a transmission/reception system according to an embodiment of the present disclosure will be described below with reference to the drawings. Note that in the description of the drawings the same components are denoted by the same reference signs and overlapping description thereof is omitted. It is intended that the present invention is not limited to the exemplifications and all changes within the scope of the claims and their equivalents are included in the present invention.

FIG. 1 is a diagram showing a schematic configuration of a transmission/reception system 1. The transmission/reception system 1 includes a transmitter 10 and a receiver 20. The receiver 20 is connected to the transmitter 10 by differential signal lines 30.

The differential signal lines 30 include a first signal line 31a, a second signal line 31b, an AC coupling capacitor 32a, and an AC coupling capacitor 32b. The AC coupling capacitor 32a is provided in the middle of the first signal line 31a. The AC coupling capacitor 32b is provided in the middle of the second signal line 31b. The AC coupling capacitors 32a and 32b have a capacitance value of 75 nF to 265 nF.

The transmitter 10 includes output terminals 10a and 10b and is configured to transmit differential signals to the receiver 20 through the output terminals 10a and 10b via the differential signal lines 30. The transmitter 10 includes an output driver 11, termination resistors 12a and 12b (first termination resistors), a switch 13 (first switch), a pulse generator 14, and a detector 17. The output driver 11 is a circuit configured to output differential signals to be sent out to the differential signal lines 30.

The termination resistors 12a and 12b and the switch 13 are provided in series between a reference voltage input terminal (first reference voltage input terminal) to which a fixed reference voltage is inputted and the differential signal lines 30. Namely, the termination resistor 12a and the switch 13 are provided in series between the reference voltage input terminal and the first signal line 31a. The termination resistor 12b and the switch 13 are provided in series between the reference voltage input terminal and the second signal line 31b.

The pulse generator 14 and the detector 17 perform RX-Detect. The pulse generator 14 is a circuit configured to output a common-mode pulse to the differential signal lines 30 (each of the first signal line 31a and the second signal line 31b). The detector 17 is a circuit configured to detect, after generation of a common-mode pulse starts, timing at which the level (voltage level) of the common-mode pulse exceeds a threshold. Unlike differential signals outputted from the output driver 11, common-mode pulses outputted from the pulse generator 14 are of the same voltage on the first signal line 31a and the second signal line 31b. Therefore, the detector 17 may compare the voltage level of either one of the common-mode pulses on the first signal line 31a and the second signal line 31b with the threshold.

The receiver 20 includes input terminals 20a and 20b and is configured to receive differential signals arriving at the input terminals 20a and 20b from the transmitter 10 via the differential signal lines 30. The receiver 20 includes an input buffer 21, termination resistors 22a and 22b (second termination resistors), and a switch 23 (forth switch). The input buffer 21 is a circuit configured to accept, as input, differential signals and perform processes such as amplification, distortion compensation, and waveform shaping on the inputted signals.

The termination resistors 22a and 22b and the switch 23 are provided in series between a reference voltage input terminal (second reference voltage input terminal) to which a fixed reference voltage is inputted and the differential signal lines 30. Namely, the termination resistor 22a and the switch 23 are provided in series between the reference voltage input terminal and the first signal line 31a. The termination resistor 22b and the switch 23 are provided in series between the reference voltage input terminal and the second signal line 31b.

The termination resistors 12a and 12b of the transmitter 10 and the termination resistors 22a and 22b of the receiver 20 are provided for high-speed transmission (e.g., 10 Gbps) and have a resistance value of, for example, 45Ω.

When the receiver 20 is not connected to the differential signal lines 30 and when, even if the receiver 20 is connected to the differential signal lines 30, the switch 23 is in an off state, the transmitter 10 determines, by RX-Detect performed by the pulse generator 14 and the detector 17, that the receiver 20 is not connected to the differential signal lines 30 in a receivable state. Then, in this case, the transmitter 10 stops the sending out of differential signals from the output driver 11 to power down the output driver 11, by which power consumption can be reduced.

Figure 2:
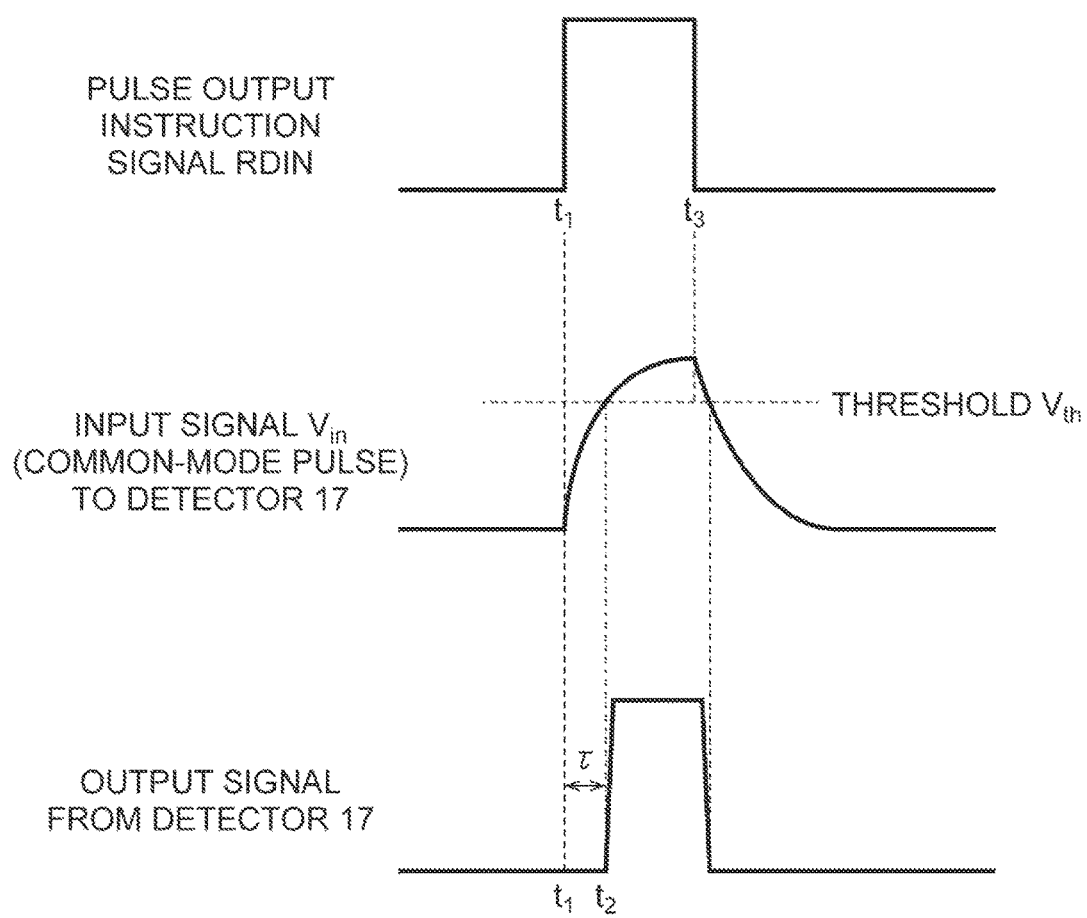
FIG. 2 is a timing chart describing RX-Detect performed by a pulse generator 14 and a detector 17 of a transmitter 10.

FIG. 2 is a timing chart describing RX-Detect performed by the pulse generator 14 and the detector 17 of the transmitter 10. When the transmitter 10 performs RX-Detect, the transmitter 10 first powers down the output driver 11 and places the switch 13 in an off state.

Thereafter, the pulse generator 14 outputs a common-mode pulse to the differential signal lines 30 during a period ($t_1$ to $t_3$) during which a pulse output instruction signal RDIN is at a significant level (high level). At this time, the voltage level of a signal inputted to the detector 17 increases at a speed according to a speed at which the AC coupling capacitors 32a and 32b (and parasitic capacitance) are charged. Namely, when the receiver 20 is not connected to the differential signal lines 30 in a receivable state, the AC coupling capacitors 32a and 32b are charged at high speed, and thus, the voltage level of a signal inputted to the detector 17 also increases rapidly. In contrast, when the receiver 20 is connected to the differential signal lines 30 in a receivable state, it takes time to charge the AC coupling capacitors 32a and 32b, and thus, the voltage level of a signal inputted to the detector 17 also increases slowly.

The detector 17 can determine whether the receiver 20 is connected to the differential signal lines 30 in a receivable state, by detecting, after time $t_1$ at which generation of the common-mode pulse starts, timing at which the voltage level of the common-mode pulse exceeds a threshold $V_{th}$. At this time, the detector 17 may determine a time period τ from time $t_1$ at which generation of the common-mode pulse starts until time $t_2$ at which the voltage level of the common-mode pulse exceeds the threshold $V_{th}$, and determine, by the length of the time period τ, whether the receiver 20 is connected to the differential signal lines 30 in a receivable state. Alternatively, the detector 17 may determine whether the receiver 20 is connected to the differential signal lines 30 in a receivable state, by determining whether the voltage level of the common-mode pulse exceeds the threshold $V_{th}$ at a time point at which a certain period of time has elapsed from time $t_1$ at which generation of the common-mode pulse starts.

Figure 3:
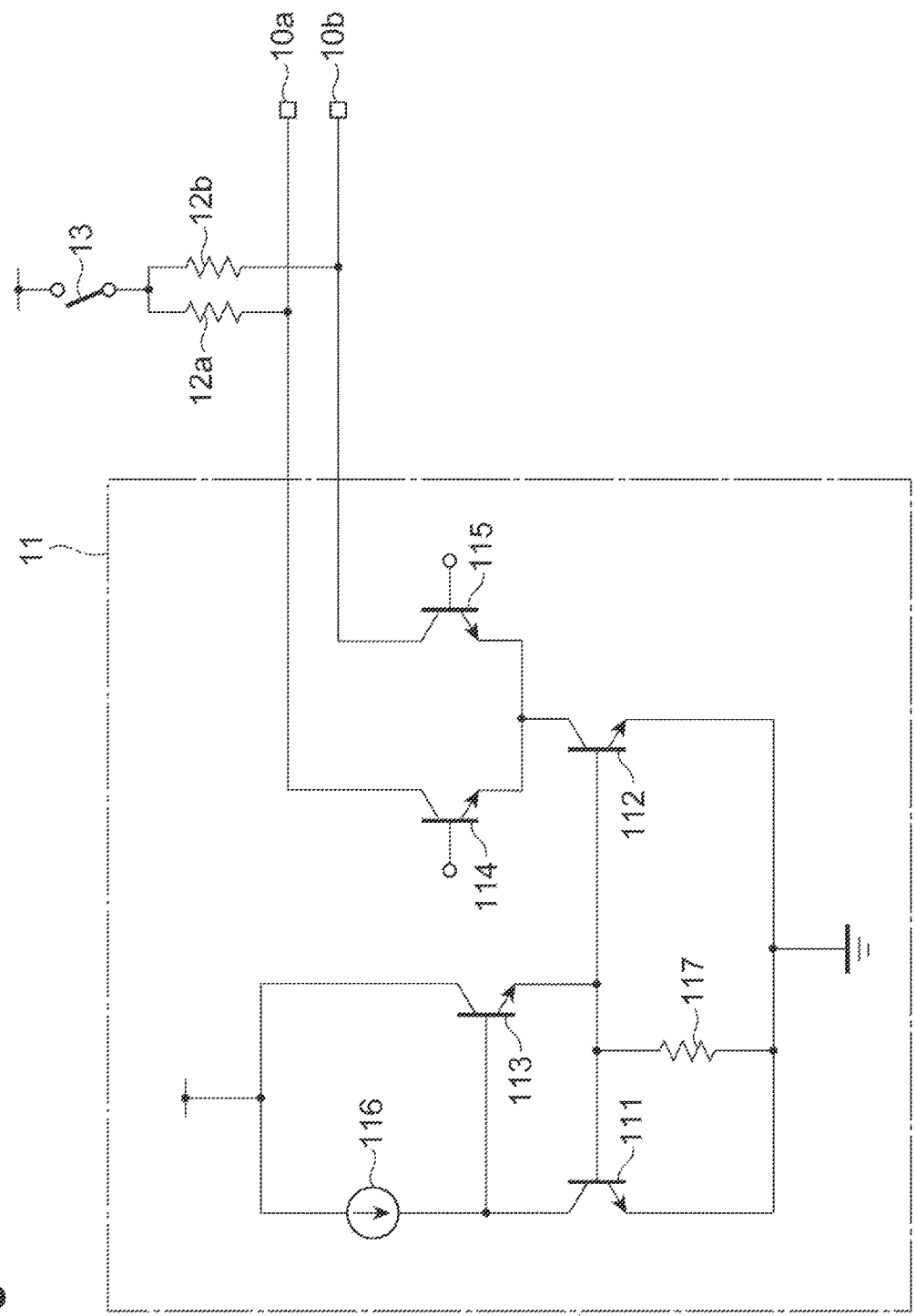
FIG. 3 is a diagram showing an exemplary circuit configuration of an output driver 11 of the transmitter 10.

FIG. 3 is a diagram showing an exemplary circuit configuration of the output driver 11 of the transmitter 10. The output driver 11 includes npn bipolar transistors 111 to 115, a constant current source 116, and a resistor 117.

The constant current source 116 is provided between a collector of the transistor 111, a base of the transistor 113, and a power supply voltage terminal. A collector of the transistor 113 is connected to the power supply voltage terminal. Emitters of the transistors 111 and 112 are connected to a ground voltage terminal. Bases of the transistors 111 and 112 are connected to an emitter of the transistor 113. The transistors 111 to 113 and the constant current source 116 form a current mirror circuit, by which a constant current can flow from the collector to emitter of the transistor 112. The resistor 117 is provided between the emitter of the transistor 113 and the ground voltage terminal.

Emitters of the transistors 114 and 115 are connected to the collector of the transistor 112. A collector of the transistor 114 is connected to the output terminal 10a. A collector of the transistor 115 is connected to the output terminal 10b. Differential signals are inputted to bases of the transistors 114 and 115, and signals obtained by amplifying the differential signals are outputted from the collectors of the transistors 114 and 115.

In general, an output driver composed of bipolar transistors has higher current driving strength than an output driver composed of MOS transistors, and thus is advantageous in terms of high-speed transmission. By placing the constant current source 116 in an off state, the output driver 11 can be powered down.

Figure 4:
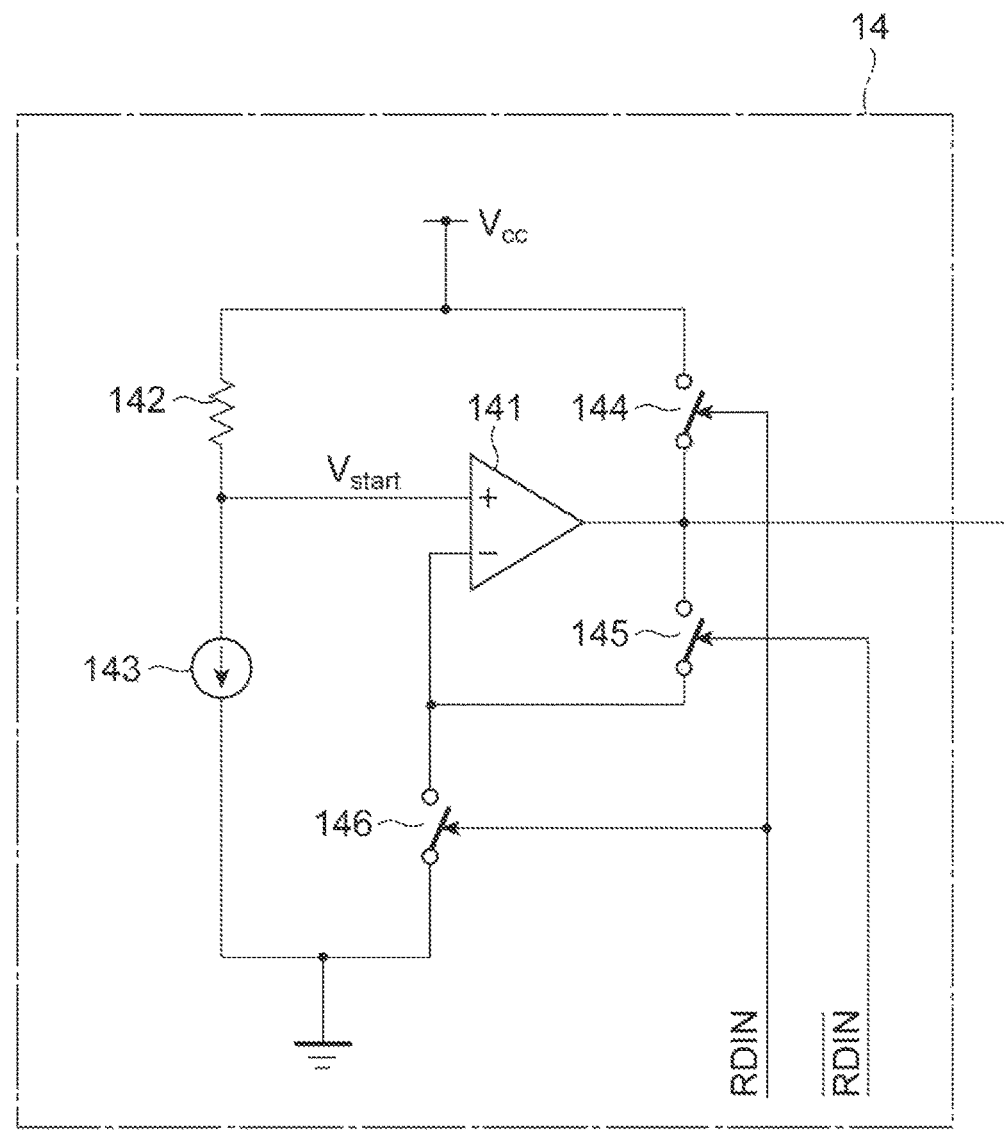
FIG. 4 is a diagram showing an exemplary circuit configuration of the pulse generator 14 of the transmitter 10.

FIG. 4 is a diagram showing an exemplary circuit configuration of the pulse generator 14 of the transmitter 10. The pulse generator 14 includes a differential amplifier 141, a resistor 142, a constant current source 143, and switches 144 to 146.

The resistor 142 is provided between a non-inverting input terminal of the differential amplifier 141 and a power supply voltage terminal. The constant current source 143 is provided between the non-inverting input terminal of the differential amplifier 141 and a ground voltage terminal. The switch 144 is provided between an output terminal of the differential amplifier 141 and the power supply voltage terminal. The switch 145 is provided between the inverting input terminal and output terminal of the differential amplifier 141. The switch 146 is provided between the inverting input terminal of the differential amplifier 141 and the ground voltage terminal. An output from the output terminal of the differential amplifier 141 serves as an output from the pulse generator 14.

The voltage level of the power supply voltage terminal is $V_{cc}$, the resistance value of the resistor 142 is $R_1$, and the current flowing through the constant current source 143 is $I_1$. The switches 144 to 146 are turned on/off according to the voltage level of a pulse output instruction signal RDIN. When the pulse output instruction signal RDIN is at a high level, the switches 144 and 146 go into an on state and the switch 145 goes into an off state, and the output from the pulse generator 14 at settling time is $V_{cc}$. When the pulse output instruction signal RDIN is at a low level, the switches 144 and 146 go into an off state and the switch 145 goes into an on state, and the output from the pulse generator 14 at settling time is $V_{start}(=V_{cc}-R_1I_1)$.

Figure 5:
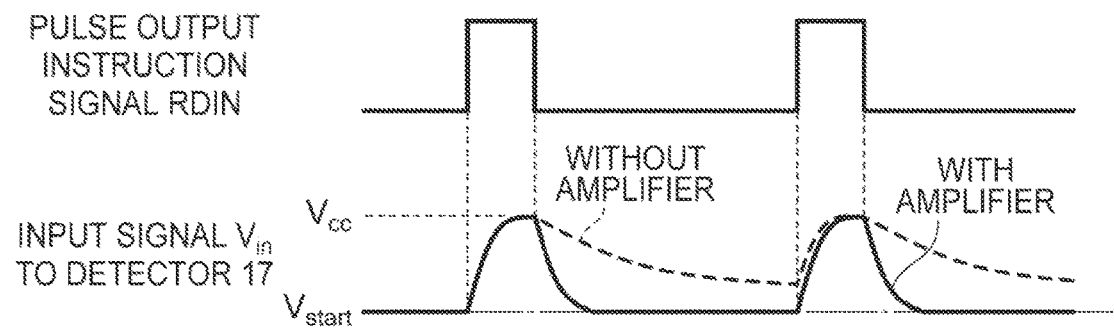
FIG. 5 is a diagram showing changes in the level of a signal inputted to the detector 17 for a case in which the circuit configuration of the pulse generator 14 shown in FIG. 4 is adopted.

FIG. 5 is a diagram showing changes in the level of a signal inputted to the detector 17 for a case in which the circuit configuration of the pulse generator 14 shown in FIG. 4 is adopted. A solid line indicates level changes for the configuration of FIG. 4 in which the differential amplifier 141 is provided, and a dashed line indicates level changes for a configuration in which the differential amplifier 141 is not provided. By adopting the circuit configuration of the pulse generator 14 shown in FIG. 4, the time required for the voltage level of a signal inputted to the detector 17 to be settled to $V_{start}$ from $V_{cc}$ can be reduced.

Figure 6:
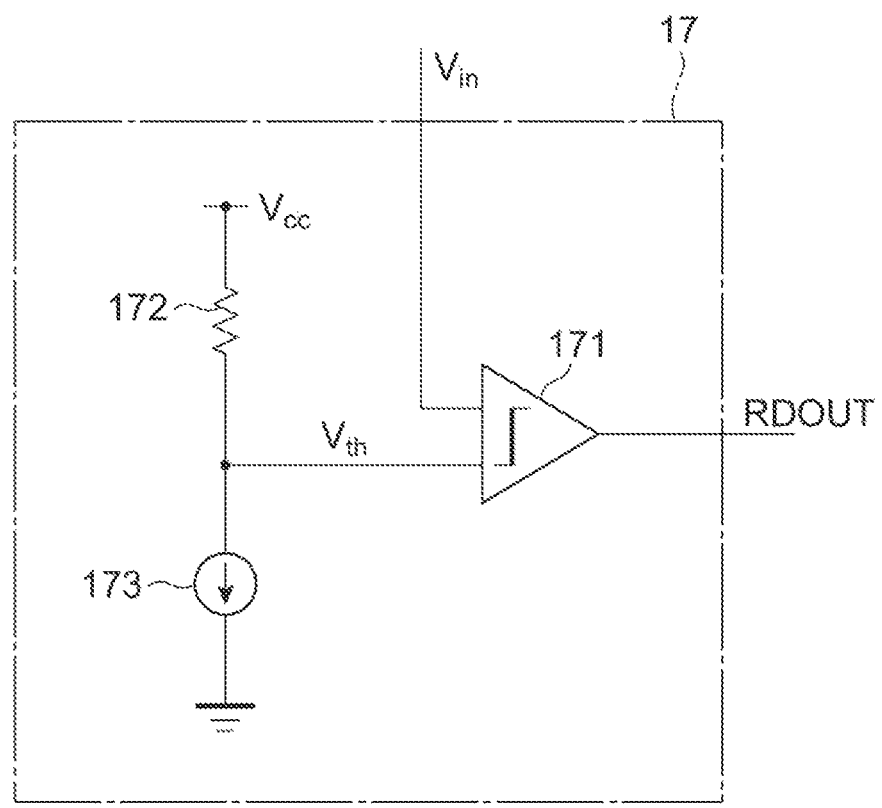
FIG. 6 is a diagram showing an exemplary circuit configuration of the detector 17 of the transmitter 10.

FIG. 6 is a diagram showing an exemplary circuit configuration of the detector 17 of the transmitter 10. The detector 17 includes a comparator 171, a resistor 172, and a constant current source 173.

A voltage $V_{in}$ inputted to a first input terminal of the comparator 171 is the voltage of the differential signal lines 30. The resistor 172 is provided between a second input terminal of the comparator 171 and a power supply voltage terminal. The constant current source 173 is provided between the second input terminal of the comparator 171 and a ground voltage terminal. When the voltage level of the power supply voltage terminal is $V_{cc}$, the resistance value of the resistor 172 is $R_2$, and the current flowing through the constant current source 173 is $I_2$, a voltage $V_{th}$ inputted to the second input terminal of the comparator 171 is $V_{cc}-R_2I_2$.

The comparator 171 compares magnitudes between the input voltage $V_{in}$ and the threshold voltage $V_{th}$. When the input voltage $V_{in}$ is greater than or equal to the threshold voltage $V_{th}$, the comparator 171 outputs a high-level signal. When the input voltage $V_{in}$ is less than the threshold voltage $V_{th}$, the comparator 171 outputs a low-level signal. Timing at which the output signal from the comparator 171 changes from a low level to a high level is timing at which the input voltage $V_{in}$ (the voltage level of a common-mode pulse) exceeds the threshold voltage $V_{th}$.

Next, a possible case will be described in which in the configuration of the transmitter 10 described above, erroneous detection occurs upon RX-Detect. When the output driver 11 is placed in a power-down state and the switch 13 is placed in an off state upon RX-Detect, since the resistance values of output resistors 15a and 15b for the pulse generator 14 are as large as several kΩ, the output terminals 10a and 10b go into a high-impedance state. The output terminals 10a and 10b being in the high-impedance state are likely to be influenced by noise, and the influence of noise extends over the detector 17.

Figure 7:
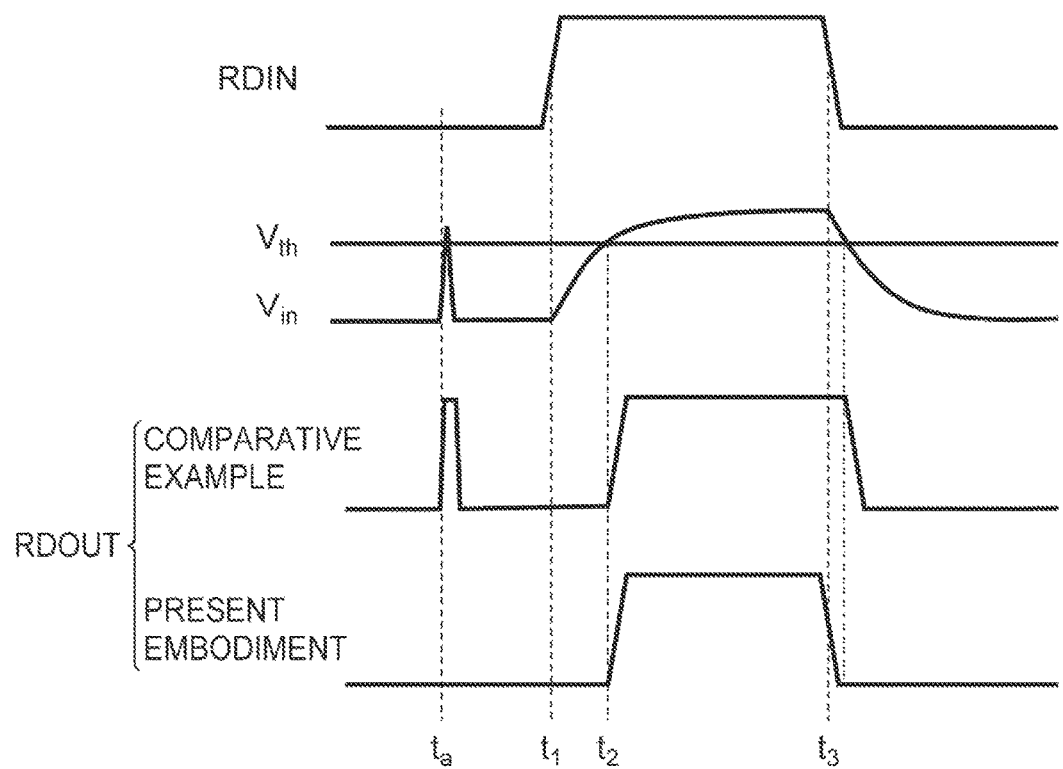
FIG. 7 is a timing chart of signals for the detector 17.

FIG. 7 is a timing chart of signals for the detector 17. The pulse output instruction signal RDIN goes to a significant level (high level) only during a period from time $t_1$ to $t_3$. The voltage level of the voltage $V_{in}$ inputted to the detector 17 starts to rise from time $t_1$. When the input voltage $V_{in}$ exceeds the threshold voltage $V_{th}$ at time $t_2$, a detection result signal RDOUT which is outputted from the detector 17 changes from a non-significant level (low level) to a significant level (high level).

However, there is a case in which noise having occurred at the output terminals 10a and 10b being in a high-impedance state is inputted to the detector 17 at time $t_o$ which is before time $t_1$ at which the pulse output instruction signal RDIN changes from a low level to a high level. At this time, the input voltage $V_{in}$ may exceed the threshold voltage $V_{th}$. In such a case, in the configuration of the detector 17 shown in FIG. 6 (comparative example), the detection result signal RDOUT outputted from the detector 17 at time $t_a$ before time $t_1$ goes to a high level, which results in erroneous detection.

Figure 8:
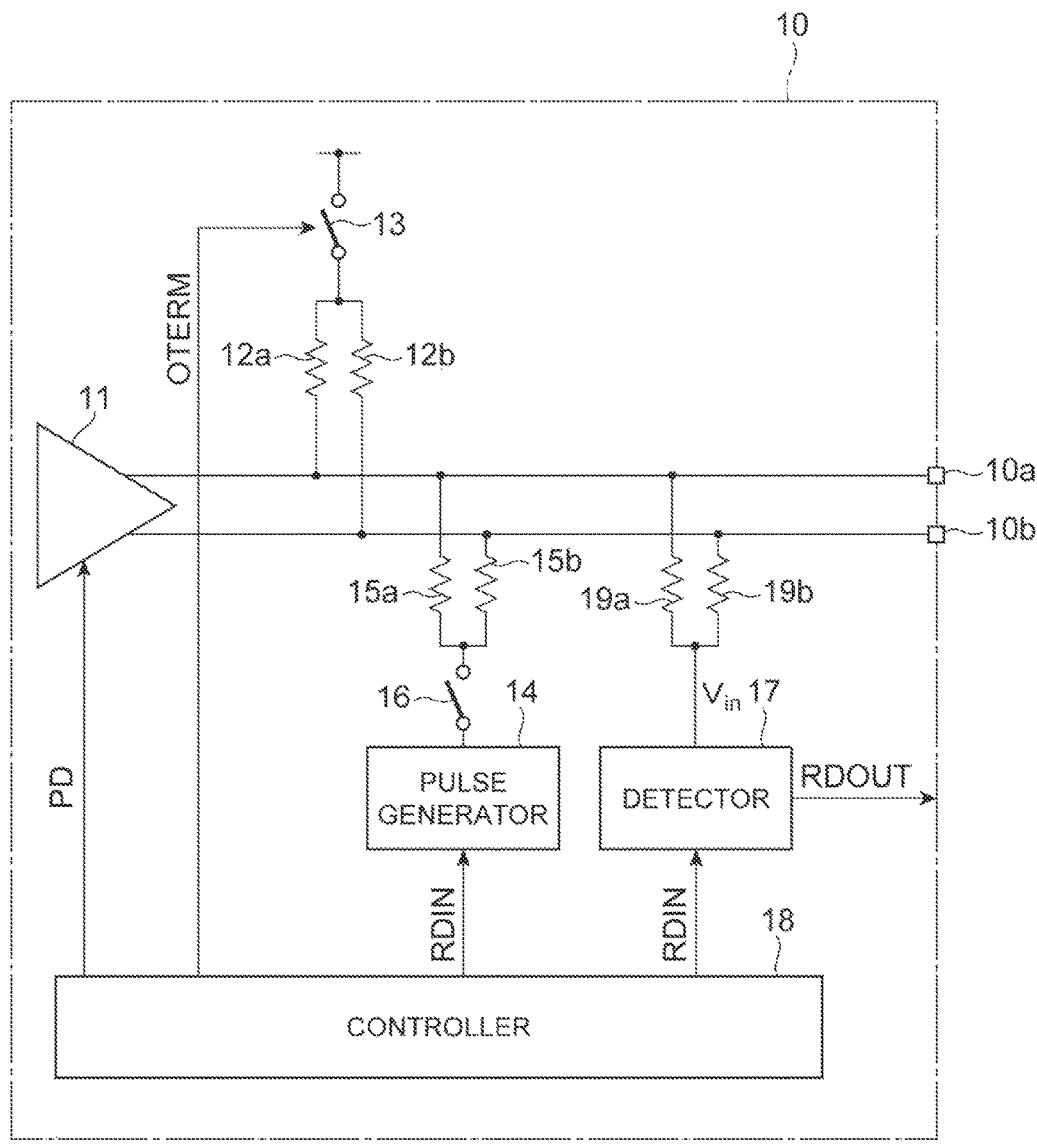
FIG. 8 is a diagram showing a configuration of the transmitter 10 according to an embodiment of the present disclosure.

The transmitter 10 according to the present embodiment which will be described below is a device intended to suppress such erroneous detection. FIG. 8 is a diagram showing a configuration of the transmitter 10 according to the present embodiment. The transmitter 10 includes the output driver 11, the termination resistors 12a and 12b, the switch 13, the pulse generator 14, output resistors 15a and 15b, a switch 16, the detector 17, a controller 18, and resistors 19a and 19b. Of these components, the output driver 11, the termination resistors 12a and 12b, the switch 13, the pulse generator 14, and the detector 17 are already described and thus description thereof is omitted here.

The output resistors 15a and 15b and the switch 16 are provided in series between an output terminal of the pulse generator 14 and the differential signal lines 30. Namely, the output resistor 15a and the switch 16 are provided in series between the output terminal of the pulse generator 14 and the first signal line 31a. The output resistor 15b and the switch 16 are provided in series between the output terminal of the pulse generator 14 and the second signal line 31b. The resistors 19a and 19b are provided between the differential signal lines 30 and an input terminal of the detector 17. Namely, the resistor 19a is provided between the first signal line 31a and the input terminal of the detector 17. The resistor 19b is provided between the second signal line 31b and the input terminal of the detector 17.

The controller 18 is a controller configured to control the operation of the transmitter 10. For the controller 18, for example, a processor such as a central processing unit (CPU) or a field programmable gate array (FPGA) is used. The controller 18 outputs an OTERM signal for controlling the on/off of the switch 13. When the OTERM signal is at a high level, the switch 13 is placed in an on state, and when the OTERM signal is at a low level, the switch 13 is placed in an off state. The controller 18 outputs a PD signal for controlling the normal operation/power-down of the output driver 11. When the PD signal is at a high level, the output driver 11 is placed in a normal operating state, and when the PD signal is at a low level, the output driver 11 is placed in a power-down state.

The controller 18 provides a pulse output instruction signal RDIN for controlling the generation of a common-mode pulse by the pulse generator 14 to the pulse generator 14 and also provides the pulse output instruction signal RDIN to the detector 17, and thereby controls the operation of each of the pulse generator 14 and the detector 17. The pulse generator 14 outputs a common-mode pulse to the differential signal lines 30 during a period (time $t_1$ to $t_3$) during which the pulse output instruction signal RDIN is at a significant level.

During a period during which the pulse output instruction signal RDIN is at a significant level, the detector 17 compares magnitudes between the voltage level (input voltage $V_{in}$) of the common-mode pulse and the threshold $V_{th}$, and outputs a detection result signal RDOUT indicating the comparison result. During a period during which the pulse output instruction signal RDIN is at a non-significant level, the detector 17 outputs a detection result signal RDOUT indicating that the voltage level (input voltage $V_{in}$) of the common-mode pulse does not exceed the threshold $V_{th}$, without comparing magnitudes between the voltage level (input voltage $V_{in}$) of the common-mode pulse and the threshold $V_{th}$. Exemplary circuit configurations of detectors 17 will be described below.

Figure 9:
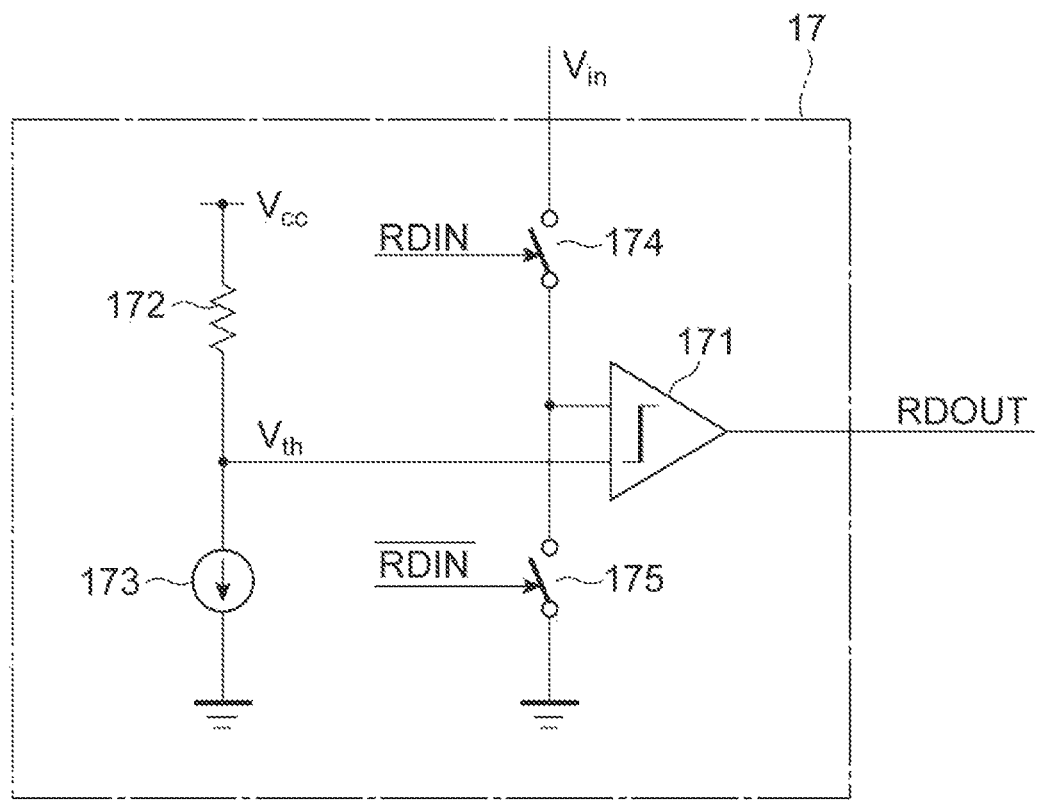
FIG. 9 is a circuit diagram of a detector 17 of a first exemplary configuration.

FIG. 9 is a circuit diagram of a detector 17 of a first exemplary configuration. The detector 17 of the first exemplary configuration further includes a switch 174 (second switch) and a switch 175 (third switch) in addition to the configuration of FIG. 6 including the comparator 171, the resistor 172, and the constant current source 173.

The comparator 171 has a first input terminal, a second input terminal, and an output terminal. The comparator 171 compares magnitudes between a voltage inputted to the first input terminal and a threshold $V_{th}$ inputted to the second input terminal, and outputs a comparison result signal having a voltage level according to the comparison result, as a detection result signal RDOUT, from the output terminal.

The switch 174 is provided between the differential signal lines 30 and the first input terminal of the comparator 171. When the pulse output instruction signal RDIN is at a significant level, the switch 174 goes into an on state, by which an input voltage $V_{in}$ is inputted to the first input terminal of the comparator 171.

The switch 175 is provided between a low-voltage terminal to which a voltage lower than the threshold $V_{th}$ (e.g., a ground voltage) is inputted, and the first input terminal of the comparator 171. When the pulse output instruction signal RDIN is at a non-significant level, the switch 175 goes into an on state, by which the voltage lower than the threshold $V_{th}$ is inputted to the first input terminal of the comparator 171.

Figure 10:
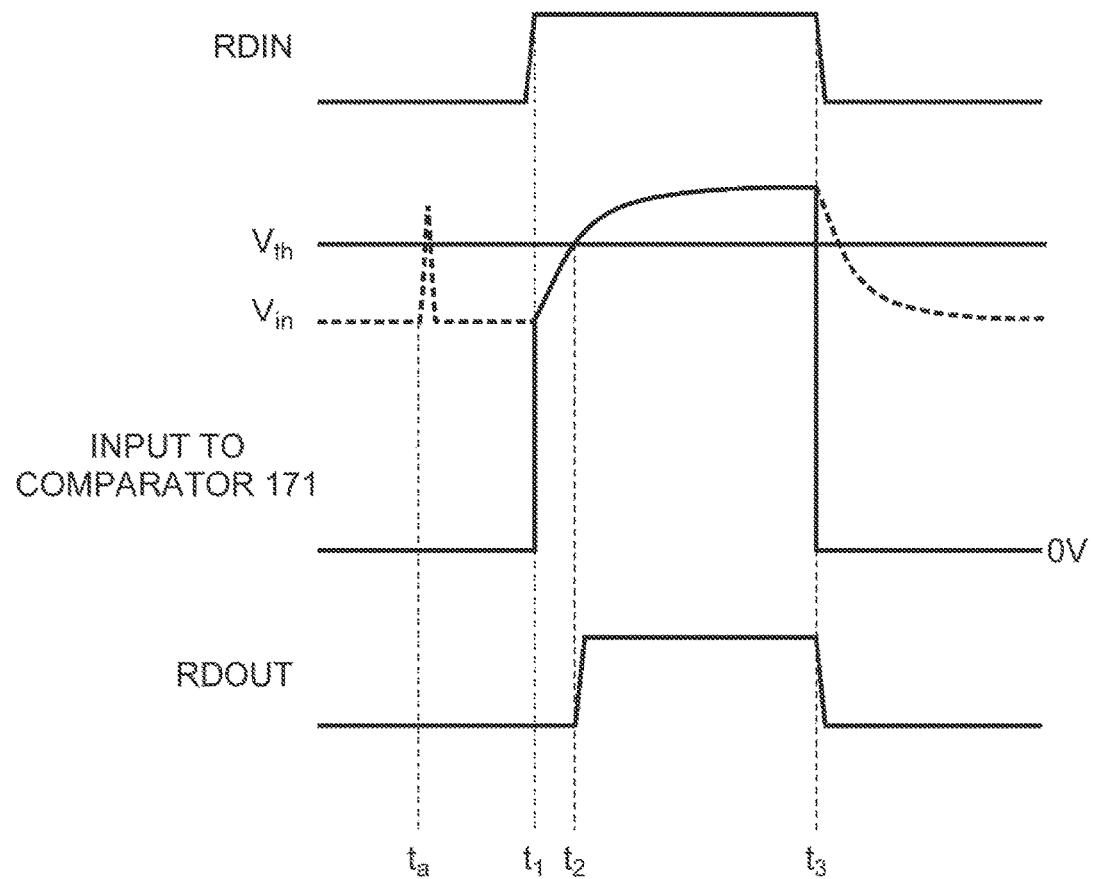
FIG. 10 is a timing chart of signals for the detector 17 of the first exemplary configuration.

FIG. 10 is a timing chart of signals for the detector 17 of the first exemplary configuration. Before time $t_1$ at which the pulse output instruction signal RDIN changes from a non-significant level (low level) to a significant level (high level), the switch 174 is in an off state and the switch 175 is in an on state, and thus, the voltage lower than the threshold $V_{th}$ is inputted to the first input terminal of the comparator 171. Therefore, even if the input voltage $V_{in}$ exceeds the threshold voltage $V_{th}$ at time $t_a$ before time $t_1$, the detection result signal RDOUT outputted from the comparator 171 remains at a low level indicating that the input voltage $V_{in}$ does not exceed the threshold $V_{th}$. By this, erroneous detection can be suppressed.

During a period from time $t_1$ to time $t_3$ during which the pulse output instruction signal RDIN is at a significant level (high level), the switch 174 is in an on state and the switch 175 is in an off state, and thus, the input voltage $V_{in}$ is inputted to the first input terminal of the comparator 171. Therefore, during the period from time $t_1$ to time $t_3$, the detection result signal RDOUT outputted from the comparator 171 indicates a magnitude relationship between the input voltage $V_{in}$ and the threshold $V_{th}$.

Figure 11:
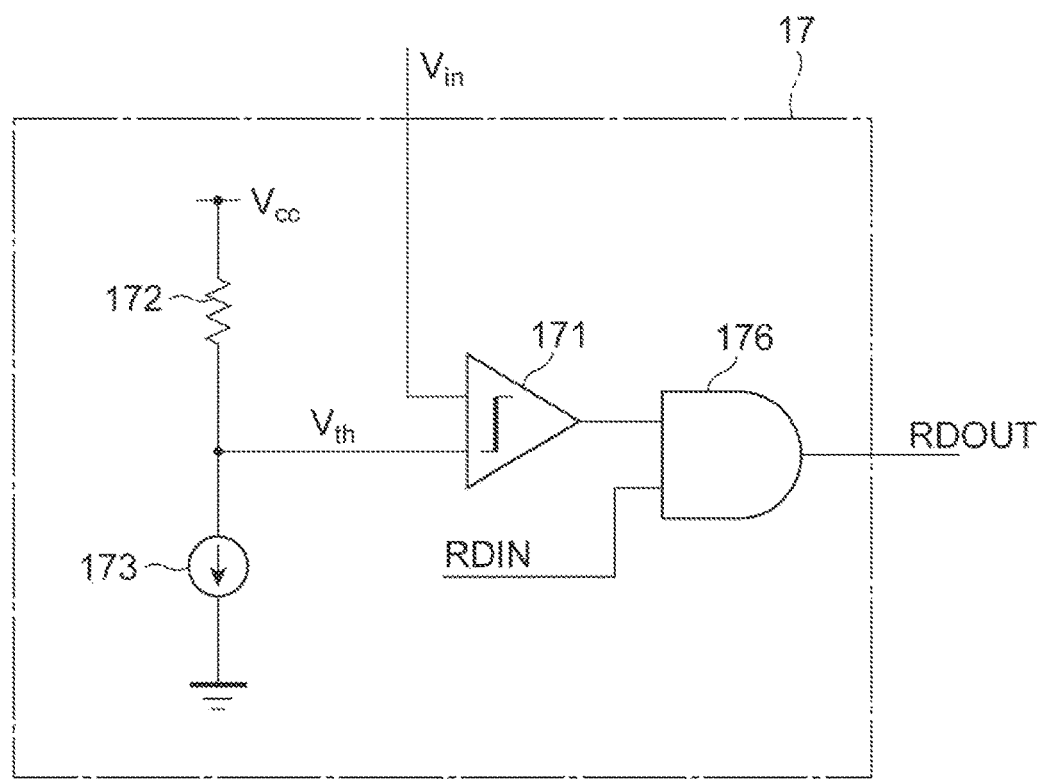
FIG. 11 is a circuit diagram of a detector 17 of a second exemplary configuration.

FIG. 11 is a circuit diagram of a detector 17 of a second exemplary configuration. The detector 17 of the second exemplary configuration further includes a gate circuit 176 in addition to the configuration of FIG. 6 including the comparator 171, the resistor 172, and the constant current source 173.

The comparator 171 has a first input terminal, a second input terminal, and an output terminal. The comparator 171 compares magnitudes between a voltage $V_{in}$ of a common-mode pulse inputted to the first input terminal and a threshold $V_{th}$ inputted to the second input terminal, and outputs a comparison result signal having a voltage level according to the comparison result, from the output terminal. Specifically, the comparator 171 outputs a significant-level comparison result signal when the voltage $V_{in}$ of the common-mode pulse exceeds the threshold $V_{th}$, and outputs a non-significant-level comparison result signal when the input voltage $V_{in}$ does not exceed the threshold voltage $V_{th}$. The gate circuit 176 outputs a signal indicating an AND between the comparison result signal outputted from the comparator 171 and a pulse output instruction signal RDIN, as a detection result signal RDOUT.

Figure 12:
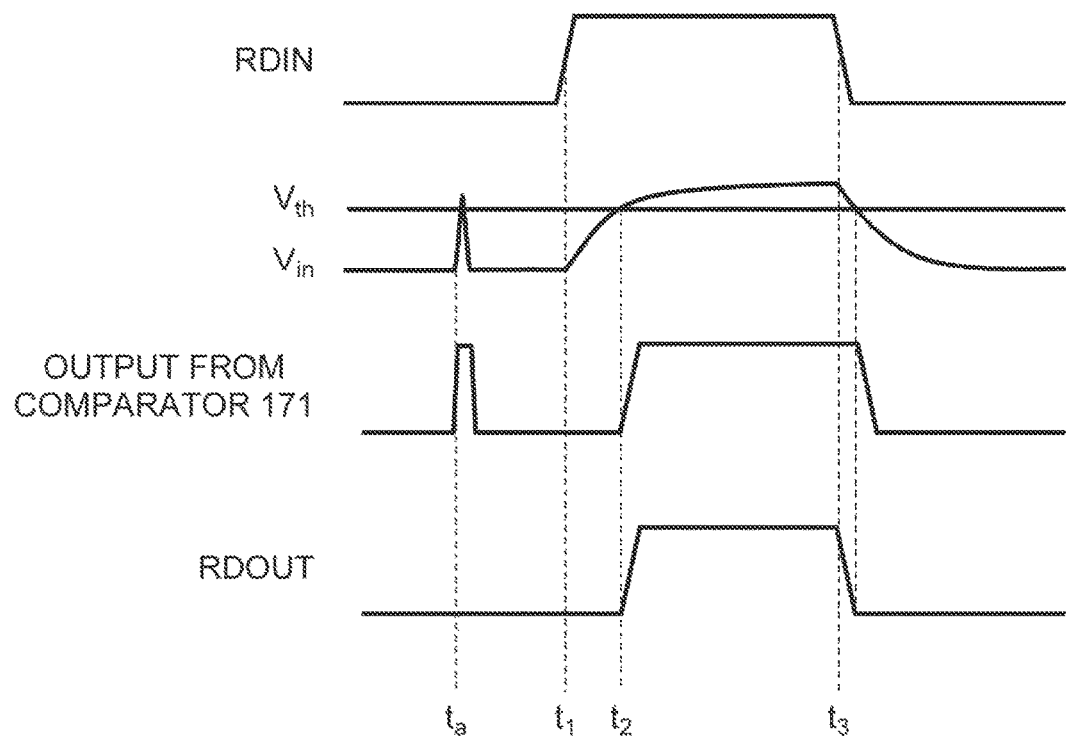
FIG. 12 is a timing chart of signals for the detector 17 of the second exemplary configuration.

FIG. 12 is a timing chart of signals for the detector 17 of the second exemplary configuration. Even if the input voltage $V_{in}$ exceeds the threshold voltage $V_{th}$ at time $t_a$ before time $t_1$ at which the pulse output instruction signal RDIN changes from a non-significant level (low level) to a significant level (high level), since a low-level pulse output instruction signal RDIN is inputted to the gate circuit 176, the AND between a comparison result signal and the pulse output instruction signal RDIN has a low level. Hence, the detection result signal RDOUT outputted from the gate circuit 176 remains at a low level indicating that the input voltage $V_{in}$ does not exceed the threshold $V_{th}$. By this, erroneous detection can be suppressed. During a period from time $t_1$ to time $t_3$ during which the pulse output instruction signal RDIN is at a significant level (high level), a high-level pulse output instruction signal RDIN is inputted to the gate circuit 176, and thus, the AND between a comparison result signal and the pulse output instruction signal RDIN has a level equal to the voltage level of the comparison result signal. Hence, the detection result signal RDOUT outputted from the gate circuit 176 is a signal indicating a magnitude relationship between the input voltage $V_{in}$ and the threshold $V_{th}$.

Figure 13:
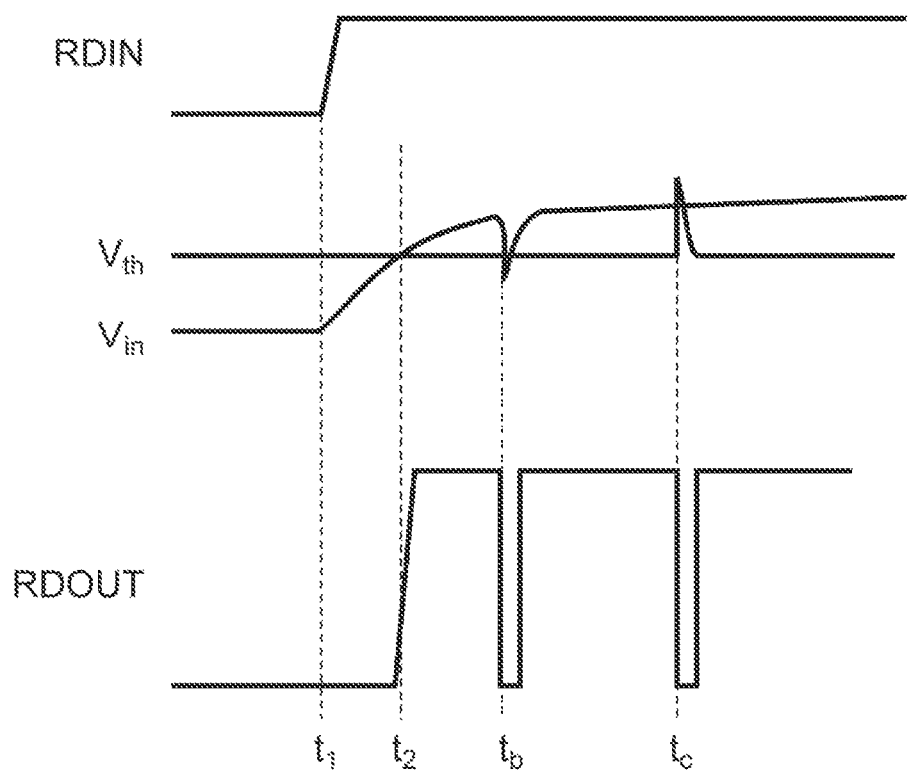
FIG. 13 is a timing chart of signals for the detector 17.

In the exemplary configurations of the detectors 17 described above, erroneous detection before time $t_1$ at which the pulse output instruction signal RDIN changes from a non-significant level (low level) to a significant level (high level) is suppressed. On the other hand, as shown in FIG. 13, there is a case in which erroneous detection occurs even during a period during which the pulse output instruction signal RDIN is at a significant level (high level). FIG. 13 is a timing chart of signals for the detector 17. At and after time $t_2$ at which the input voltage $V_{in}$ is supposed to be higher than the threshold $V_{th}$ in a period during which the pulse output instruction signal RDIN is at a significant level (high level), the input voltage $V_{in}$ may become lower than the threshold $V_{th}$. For example, due to the influence of noise from a peripheral circuit, the input voltage $V_{in}$ decreases at time $t_b$ or the threshold $V_{th}$ increases at time $t_c$, by which the input voltage $V_{in}$ may become lower than the threshold $V_{th}$. In such a case, the output signal from the comparator 171 goes to a low level, which results in erroneous detection.

Figure 14:
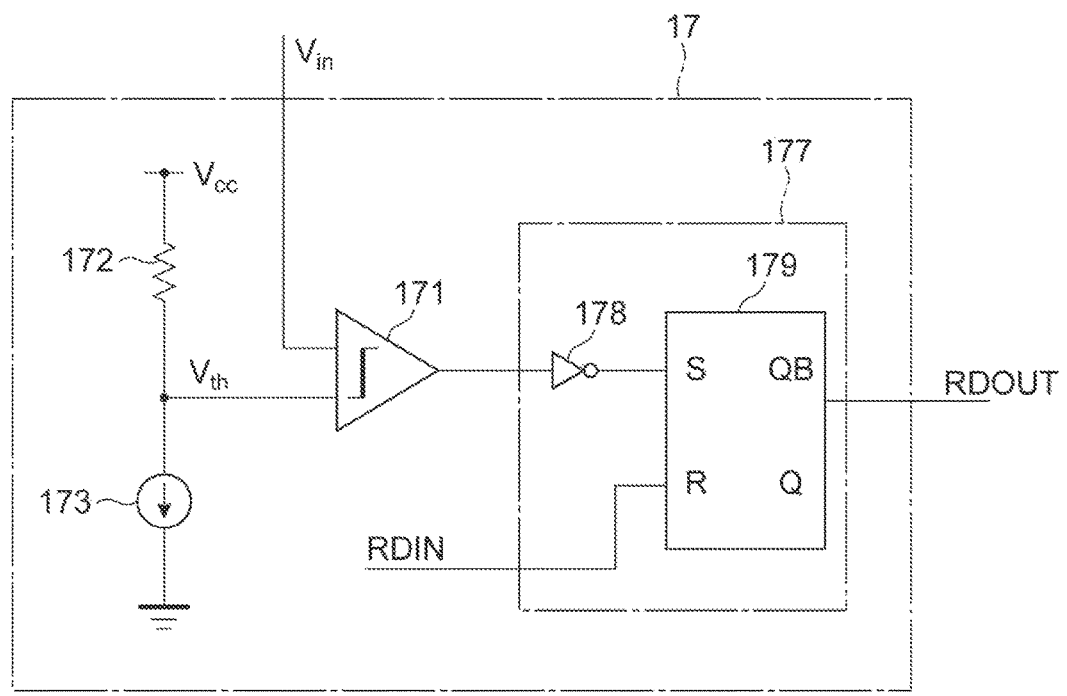
FIG. 14 is a circuit diagram of a detector 17 of a third exemplary configuration.

A detector 17 of a third exemplary configuration described below is configured intended to suppress such erroneous detection. FIG. 14 is a circuit diagram of the detector 17 of the third exemplary configuration. The detector 17 of the third exemplary configuration further includes a latch circuit 177 in addition to the configuration of FIG. 6 including the comparator 171, the resistor 172, and the constant current source 173.

The comparator 171 has a first input terminal, a second input terminal, and an output terminal. The comparator 171 compares magnitudes between a voltage $V_{in}$ of a common-mode pulse inputted to the first input terminal and a threshold $V_{th}$ inputted to the second input terminal, and outputs a comparison result signal having a voltage level according to the comparison result, from the output terminal. Specifically, the comparator 171 outputs a significant-level comparison result signal when the voltage $V_{in}$ of the common-mode pulse exceeds the threshold $V_{th}$, and outputs a non-significant-level comparison result signal when the input voltage $V_{in}$ does not exceed the threshold voltage $V_{th}$. The latch circuit 177 continuously outputs a significant-level signal as a detection result signal RDOUT after the comparison result signal outputted from the comparator 171 changes from a non-significant level to a significant level during a period during which the pulse output instruction signal RDIN is at a significant level.

Figure 15:
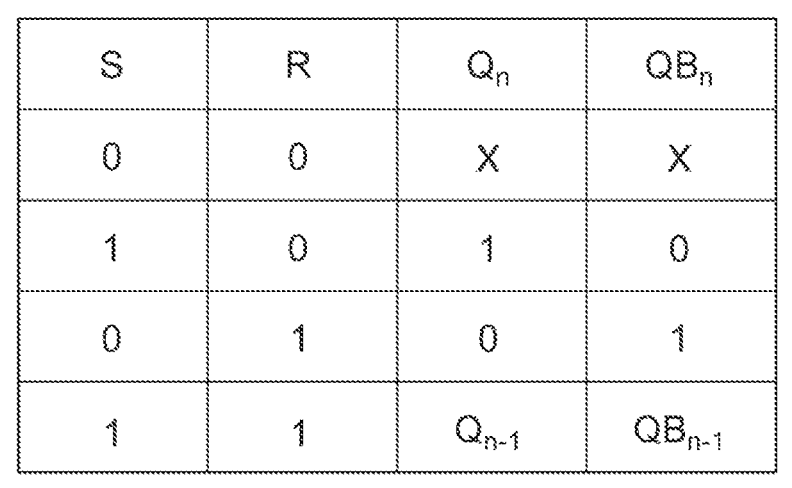

The latch circuit 177 includes an inverter circuit 178 and an SR flip-flop 179. The SR flip-flop 179 accepts, as input and at an S input terminal, a signal obtained by logically inverting, by the inverter circuit 178, a comparison result signal outputted from the comparator 171, accepts, as input and at an R input terminal, a pulse output instruction signal RDIN, and outputs a detection result signal RDOUT from a QB output terminal. FIG. 15 is a truth table for the input and output signals to/from the SR flip-flop 179. The latch circuit 177 of such a configuration can continuously output a significant-level signal as a detection result signal RDOUT from the QB output terminal after the comparison result signal outputted from the comparator 171 changes from a non-significant level to a significant level (i.e., after the signal inputted to the S input terminal changes from a high level to a low level) during a period during which the pulse output instruction signal RDIN inputted to the R input terminal is at a significant level.

Figure 16:
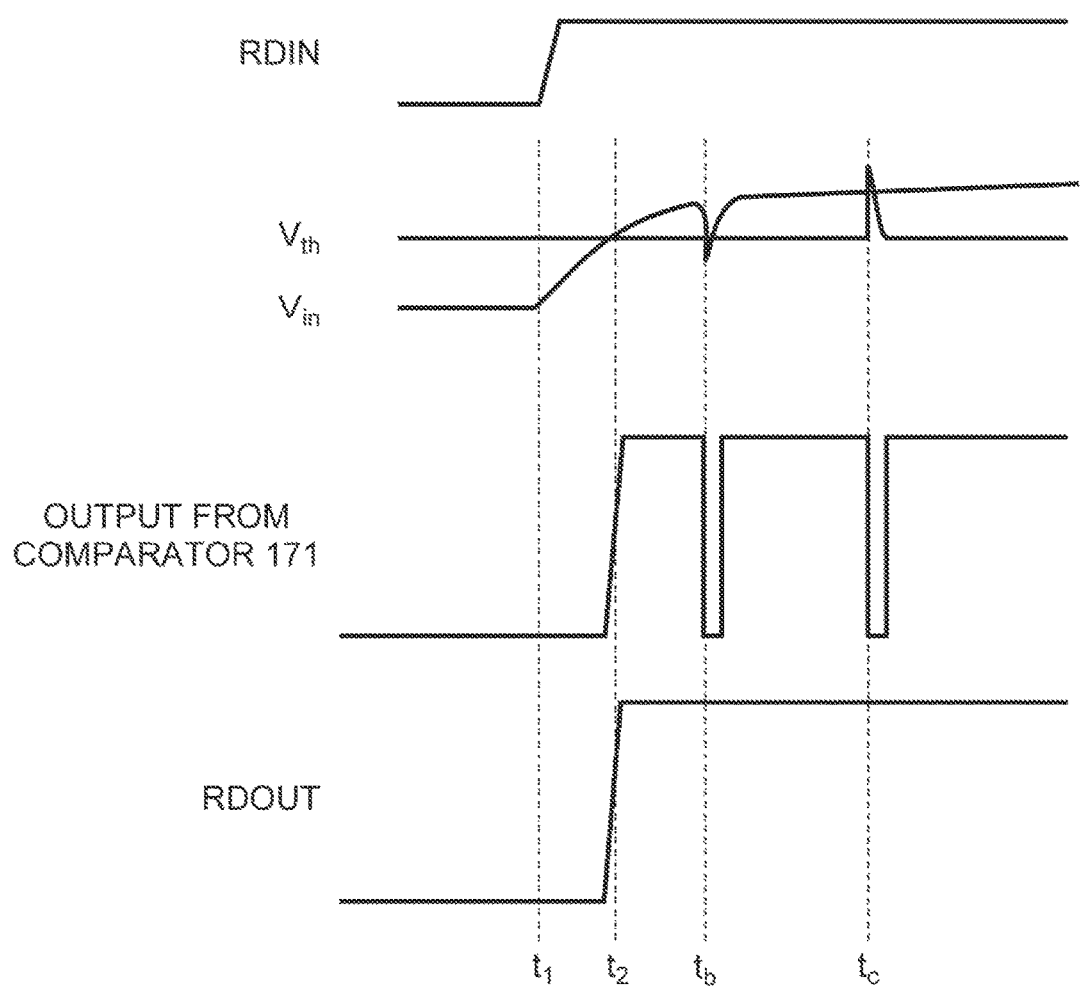
FIG. 16 is a timing chart of signals for the detector 17 of the third exemplary configuration.

FIG. 16 is a timing chart of signals for the detector 17 of the third exemplary configuration. At time $t_1$, the pulse output instruction signal RDIN changes from a non-significant level to a significant level. At time $t_2$ after time $t_1$, the input voltage $V_{in}$ becomes higher than the threshold $V_{th}$ and thus the comparison result signal outputted from the comparator 171 changes from a non-significant level to a significant level. At a time after time $t_2$ (i.e., after the signal inputted to the S input terminal changes from a high level to a low level), even if the output signal from the comparator 171 goes to a non-significant level (low level) at time $t_b$ and $t_c$, the detection result signal RDOUT continuously remains at a significant level (high level). By this, erroneous detection can be suppressed.

What is claimed is:

1. A transmitter that transmits differential signals to a receiver via differential signal lines having AC coupling capacitors provided in middle of the differential signal lines, the transmitter comprising:
   an output driver configured to output the differential signals to the different signal lines;
   first termination resistors and a first switch, the first termination resistors and the first switch being provided in series between a first reference voltage input terminal and the differential signal lines, a reference voltage being transmitted to the first reference voltage input terminal;

a pulse generator configured to output a common-mode pulse to the differential signal lines during a period during which a pulse output instruction signal is at a significant level; and a detector configured to output a detection result signal indicating a magnitude relationship between a voltage level of the common-mode pulse and a threshold during a period during which the pulse output instruction signal is at a significant level, and output a detection result signal indicating that the voltage level of the common-mode pulse does not exceed the threshold, during a period during which the pulse output instruction signal is at a non-significant level, wherein the detector includes:

a comparator having a first input terminal, a second input terminal, and an output terminal and configured to compare magnitudes between a voltage of the common-mode pulse inputted to the first input terminal and a threshold inputted to the second input terminal, and output a comparison result signal from the output terminal, the comparison result signal going to a significant level when the voltage of the common-mode pulse exceeds the threshold; and a latch circuit configured to continuously output a significant-level signal as the detection result signal after the comparison result signal changes to a significant level during a period during which the pulse output instruction signal is at a significant level.

2. A transmission/reception system comprising:

a transmitter that transmits differential signals to a receiver via differential signal lines having AC coupling capacitors provided in middle of the differential signal lines, the transmitter comprising:

an output driver configured to output the differential signals to the differential signal lines;

first termination resistors and a first switch, the first termination resistors and the first switch being provided in series between a first reference voltage input terminal and the differential signal lines, a reference voltage being inputted to the first reference voltage input terminal;

a pulse generator configured to output a common-mode pulse to the differential signal lines during a period during which a pulse output instruction signal is at a significant level; and a detector configured to output a detection result signal indicating a magnitude relationship between a voltage level of the common-mode pulse and a threshold, during a period during which the pulse output instruction signal is at a significant level, and output a detection result signal indicating that the voltage level of the common-mode pulse does not exceed the threshold, during a period during which the pulse output instruction signal is at a non-significant level, wherein the detector includes:

a comparator having a first input terminal, a second input terminal, and an output terminal and configured to compare magnitudes between a voltage of the common-mode pulse inputted to the first input terminal and a threshold inputted to the second input terminal, and output a comparison result signal from the output terminal, the comparison result signal going to a significant level when the voltage of the common-mode pulse exceeds the threshold; and a latch circuit configured to continuously output a significant-level signal as the detection result signal after the comparison result signal changes to a significant level during a period during which the pulse output instruction signal is at a significant level; and a receiver connected to the transmitter by the differential signal lines, wherein the receiver includes: an input buffer configured to accept, as input, differential signals arriving from the transmitter via the differential signal lines; and second termination resistors and a forth switch, the second termination resistors and the forth switch being provided in series between a second reference voltage input terminal and the differential signal lines, a reference voltage being inputted to the second reference voltage input terminal.

* * * * *